(12) United States Patent
Nguyen et al.

(10) Patent No.: US 6,844,527 B2
(45) Date of Patent: Jan. 18, 2005

(54) MULTI-THERMAL ZONE SHIELDING APPARATUS

(75) Inventors: Tue Nguyen, Fremont, CA (US); Craig Alan Bercaw, Los Gatos, CA (US)

(73) Assignee: Tegal Corporation, Petaluma, CA (US)

( * ) Notice: Subject to any disclaimer, the term of this patent is extended or adjusted under 35 U.S.C. 154(b) by 518 days.

(21) Appl. No.: 09/766,135

(22) Filed: Jan. 19, 2001

(65) Prior Publication Data

US 2002/0000203 A1 Jan. 3, 2002

Related U.S. Application Data

(63) Continuation of application No. 09/589,623, filed on Jun. 7, 2000, now Pat. No. 6,221,166.

(51) Int. Cl.[7] .................................................. F27B 5/14
(52) U.S. Cl. ........................ 219/390; 219/405; 219/411; 118/724; 118/725; 118/729; 392/416; 392/418
(58) Field of Search ................................. 219/396, 405, 219/411; 392/416, 418; 118/724, 725, 50.1, 729, 720–721

(56) References Cited

U.S. PATENT DOCUMENTS

| | | | | |
|---|---|---|---|---|
| 4,932,358 A | | 6/1990 | Studley et al. | |
| 5,304,248 A | * | 4/1994 | Cheng et al. | 118/728 |
| 5,965,047 A | * | 10/1999 | Blersch et al. | 219/390 |
| 5,991,508 A | * | 11/1999 | Ohmine et al. | 392/418 |
| 6,036,782 A | * | 3/2000 | Tanaka et al. | 118/715 |
| 6,069,135 A | | 5/2000 | Falk et al. | |
| 6,096,135 A | * | 8/2000 | Guo et al. | 118/729 |

* cited by examiner

*Primary Examiner*—Shawntina Fuqua
(74) *Attorney, Agent, or Firm*—Fliesler Meyer LLP

(57) ABSTRACT

A multi-thermal zone shielding apparatus provides a multi-zone temperature profile for the shield while shielding a portion of a hot workpiece in a high temperature processing system. The apparatus keeps the workpiece temperature hot at the shielded area and maintains the rest of the shield at a lower temperature. The apparatus includes a multi-thermal zone shield having a low thermal transmissivity section for preventing heat loss from the shielded portion of the hot workpiece due to less thermal energy being transmitted through the shielding portion of the shield, thus maintaining a more uniform temperature at the shielded portion of the workpiece, and a high thermal transmissivity section in the rest of shield for allowing more thermal energy from the hot workpiece to be transmitted through the shield without heating the shield, thus maintaining a lower temperature at the portion of the shield that is not engaged with the workpiece. The apparatus can further include a non-reactive gas inlet for creating a pressurized cavity in the vicinity of the shielded portion of the workpiece.

7 Claims, 6 Drawing Sheets

MULTI-THERMAL ZONE SHIELDING APPARATUS

This application is a continuation of U.S. patent application Ser. No. 09/589,625, filed Jun. 7, 2000, now U.S. Pat. No. 6,221,166.

FIELD OF THE INVENTION

The present invention relates generally to apparatus for processing of a semiconductor wafer, and more particularly to an edge exclusion apparatus employing a multi-thermal zone shield to provide a multi-zone temperature profile for the shield while shielding a portion of a hot workpiece in a high temperature processing system.

BACKGROUND OF THE INVENTION

During the deposition of materials on a semiconductor wafer, it is desirable to prevent materials from depositing on the edge of the front surface, on the end edges and on the backside of the wafer. This is important when the wafer requires surface treatment to improve the adhesion of the deposited material as in the case of tungsten deposition. The wafer surface needs to be coated with an adhesion promoter material such as titanium tungsten (TiW), or titanium nitride (TiN) before the deposition of tungsten to ensure proper adhesion. When tungsten is deposited on the front edge, on end edges or on backside of the wafer where there is no TiW or TiN, the deposited tungsten does not adhere properly and can flake off as particles. The generation of particles such as these could be damaging to subsequent wafer processing. Edge and backside exclusion is also of particular importance when the deposited materials require a diffusion barrier layer to prevent the deposited materials from reaching the silicon wafer, which can create device degradation. For example, copper can be deposited on a diffusion barrier layer such as TiN, tantalum nitride, or tungsten nitride. Without the diffusion barrier layer, the copper could migrate to the silicon area and lower device performance. Deposition of copper on the backside, on the end edges or on the front edge where there is no diffusion barrier material severely affects device properties.

FIG. 1 shows a prior art edge exclusion apparatus employing purging gas to prevent edge and backside deposition. Deposition precursor enters the inlet 20, and deposits on the wafer 10. The inlet 20 could be a showerhead, providing precursor flow 16 to the wafer 10 at a more uniform distribution. Purging gas 15 enters the gap between the wafer holder 30 and the blocker 24 to prevent material deposition at the wafer 10 edge and backside. Precursor flow 16 continues to 26 and purging gas 15 continues to 25 to reach the exhaust. The major drawback of this prior art apparatus is the high purging gas flow rate required to prevent edge and backside deposition, which is typically in the range of liter per minute flow. Therefore, this apparatus is not suitable for a system using low precursor flow.

Another prior art apparatus as disclosed in U.S. Pat. No. 4,932,358 to Studley et al. includes a seal ring which presses down against a wafer that is on a CVD chuck. The seal ring presses continuously around the outer periphery of the wafer. Sufficient force is applied to hold the backside of the wafer against the chuck. This apparatus requires a complicated mounting mechanism to move the seal ring in and out of clamping engagement with the wafer and to maintain alignment between the seal ring and the wafer. Furthermore, the seal ring can only be as wide as the diameter of the chuck.

FIG. 2 shows a prior art apparatus from U.S. Pat. No. 5,851,299 to Cheng et al. which includes a shield ring 50 that normally rests on a ring support 72. The shield ring 50 engages the front side edge of the wafer 10 when the wafer support 40 is raised into the contact position by the susceptor lift 46. The wafer edge and backside are shielded from the precursor flow from the showerhead 20. Cheng et al. also discloses an additional purging gas flow 1 which is retained in the cavity between the wafer support 40, the wafer 10 and the shield ring 50. The purging gas exhausts through the gap 2 between the ring support 72 and the shield ring 50, and combines with the precursor exhaust 3 to reach the vacuum pump.

As with the other prior art, the major drawback of this shield ring is that eventually there will be some deposition at the edge of the shield ring at the locations where the shield ring contacts the wafer. The gap between the shield ring and the wafer, which is caused by material deposition widens over time. This process causes the shield ring to lose contact with the wafer so that the shield ring no longer performs the shielding function. The apparatus will need to be shut down, the chamber vented, and the shield ring manually replaced. The chamber will have to be pumped down and the system will have to be conditioned for process qualification before operating again. This procedure causes a significant loss in productivity.

The purging gas is helpful in reducing the build up of material deposit at the shield ring edge. However in the prior art Cheng et al. apparatus, as seen in FIG. 2, the purging gas can easily escape through the big gap between the shield ring 50 and the ring support 72. In the Cheng et al. apparatus, this gap is required for proper shielding of the wafer. The minimum gap size is probably 0.1" to allow adequate separation between the shield ring and the wafer for the removal of the wafer. Assuming a 10" diameter for the shield ring for the processing of an 8" wafer, the purging gas area is 0.1×10, which translates into an equivalent diameter D of 1.1". The 1.1" diameter opening would require a very high flow rate in order to retain the purging gas at the connection of the wafer and the shield ring to prevent material deposition at that location, especially when the typical inlet of the purging gas is only 0.25" in diameter.

Another major draw back of the prior art apparatus is the uniform temperature profile of the shield ring in high temperature processing systems. In these systems, the wafer is heated for the process reaction to take place, but it is desirable to have the shield ring cooler than the wafer to prevent reaction at the shield ring. Using high thermal conductivity materials will raise the temperature of the shield ring through the transfer of thermal energy from the heated wafer. Using low thermal conductivity materials will lower the temperature of the shield ring, but the wafer temperature will no longer be uniform because of the heat loss at the contact area caused by the cool shield ring. Using a high thermal reflectivity material would solve this problem because all the heat would be reflected back, and the shield would be cooled without draining the thermal energy from the wafer edge. However, there is currently no effective high thermal reflectivity material available.

It would be advantageous to develop a shielding apparatus that has a variable temperature profile.

It would be advantageous to develop a shielding apparatus that does not cause the heat loss at the wafer edge.

It would be advantageous to develop a shielding apparatus that reduces the down time of the system.

It would be advantageous to develop an apparatus with a smaller purging gas escape flow.

SUMMARY OF THE INVENTION

Accordingly, a multi-thermal zone shielding apparatus is provided. The apparatus includes a shield with multiple zones having different thermal properties. In the shield area that is in contact with the workpiece for shielding purposes, the shield material has low heat transmissivity properties in order to retain heat in the workpiece. In the rest of the shield area, the shield material has high heat transmissivity properties in order to prevent the shield from absorbing the heat.

The multi-thermal zone shielding apparatus for shielding a portion of a hot workpiece in a high temperature processing system while keeping the workpiece temperature high at the shielded area and maintaining the rest of the shield at a lower temperature comprises:

a) a heater means for heating the workpiece within the system;

b) a multi-thermal zone shield for engaging a portion of the workpiece and shielding the engaged portion of the workpiece during processing thereof to prevent processing on the engaged portion of the workpiece, the multi-thermal zone shield comprising a low thermal transmissivity section in the portion of the shield that engages and shields the workpiece, the low transmissivity section prevents heat loss from the shielded portion of the hot workpiece due to less thermal energy being transmitted through the shielding portion of the shield, thus maintaining a more uniform temperature at the shielded portion of the workpiece;

a high thermal transmissivity section in the rest of shield, the portion of the shield that does not engage the workpiece has a high thermal transmissivity allows more thermal energy from the heater means and from the hot workpiece to transmit through the shield without heating the shield, thus maintaining a lower temperature at the portion of the shield that is not engaged with the workpiece; and c) a moving means for engaging the shield with the portion of the workpiece.

In some aspects of the invention, the thermal transmissivity property is equivalent to light transmissivity as in the case of infrared heating.

In some aspects of the invention, the shield is made of transparent material, and the low thermal transmissivity section of the shield is processed to achieve an opaque property.

In some aspects of the invention, the low thermal transmissivity section of the shield is made of opaque material and the high thermal transmissivity section of the shield is made of transparent material.

In some aspects of the invention, the shield is made of quartz or glass material, and the low thermal transmissivity section of the shield is processed to become opaque and the high thermal transmissivity section of the shield is processed to become transparent.

In some aspects of the invention, the heater means comprises a heated workpiece support having a heated top surface for supporting and heating the workpiece. In some aspects of the invention, the moving means for engaging the shield with the portion of the workpiece comprises a movable shaft that is connected to the heated workpiece support. In some aspects of the invention, the movable shaft consists of a shaft that is connected to a linear guide for allowing the shaft to travel in a straight line. An air cylinder or a motor, such as a stepper motor or a servo motor, could serve to power the movable shaft.

In some aspects of the invention, the heater means comprises a lamp heater for heating the workpiece and the apparatus further comprises a non-heated workpiece support for supporting the workpiece. In some aspects of the invention, the moving means for engaging the shield with the portion of the workpiece comprises a movable shaft that is connected to the non-heated workpiece support.

In some aspects of the invention, the heated workpiece support comprises a tapered outer edge and the shield comprises a tapered inner edge of similar angle, whereby the shield may be moved into alignment with the workpiece support in the engaged position.

The present invention further provides a shield support means for supporting the shield so that the shield and the workpiece are spaced apart when the workpiece support moving means disengages the workpiece from the shield. The shield support separates the shield from the workpiece in the disengaged position so that the workpiece can be replaced without disturbing the shield.

In a preferred embodiment for vacuum applications, the multi-thermal zone shielding apparatus for shielding a portion of a hot workpiece in a high temperature processing system while keeping the workpiece temperature high at the shielded area and maintaining the rest of the shield at a lower temperature comprises:

a) a heated workpiece support for heating and supporting the workpiece within the system;

b) a multi-thermal zone shield for engaging a portion of the workpiece and shielding the engaged portion of the workpiece during processing thereof to prevent processing on the engaged portion of the workpiece, the multi-thermal zone shield comprising a low thermal transmissivity section in the portion of the shield that engages and shields the workpiece, the low transmissivity section prevents heat loss from the shielded portion of the hot workpiece due to less thermal energy being transmitted through the shielding portion of the shield, thus maintaining a more uniform temperature at the shielded portion of the workpiece;

a high thermal transmissivity section in the rest of shield, the portion of the shield that does not engage the workpiece has a high thermal transmissivity allows more thermal energy from the heater means and from the hot workpiece to transmit through the shield without heating the shield, thus maintaining a lower temperature at the portion of the shield that is not engaged with the workpiece;

c) a moving means for engaging the shield with the portion of the workpiece; and d) a non-reactive gas inlet for providing a non-reactive gas to a cavity defined by the heated workpiece support, the workpiece, and the shield, the cavity retaining the non-reactive gas in the vicinity of the shielded portion of the workpiece.

The additional non-reactive gas inlet maintains a higher pressure in the cavity that is defined by the workpiece support, the workpiece, the shield and the shield restraint clamp than the pressure in the processing system, thus the higher pressure provides further assurance that the depositing material will not deposit at the edge and backside of the workpiece.

In some aspects of the invention, the shield stays close to the workpiece support so that the cavity retaining the non-reactive gas has no large leaks when the workpiece support moving means engages the workpiece with the shield. To maintain a high differential pressure between the cavity and the chamber pressure, the cavity needs to not have large leakage. In some aspects of the invention, the shield rests on the workpiece support when the moving means engages the workpiece with the shield in order to maintain small leakage inside the cavity.

In some aspects of the invention, the workpiece is a semiconductor wafer and the top surface of the workpiece support is circular. The cavity also retains the non-reactive gas in the vicinity of the circumferential edge of the semiconductor wafer.

In another preferred embodiment of the invention, the apparatus provides a replacement means for the shielding plate that can be installed without significant system down time. The apparatus provides a replaceable multi-thermal zone workpiece shielding plate for engaging a portion of the workpiece and shielding the engaged portion of the workpiece during processing thereof to prevent processing on the engaged portion of the workpiece in a high temperature processing system. The apparatus keeps the workpiece temperature hot at the shielded area and maintains the rest of the shield at a cooler temperature. The apparatus comprises:

a) a replaceable shield of comparable weight as that of the workpiece for allowing replacement of the shield in the same way as the replacement of the workpiece;

b) a low thermal transmissivity section in the portion of the shield that engages and shields the workpiece, the low transmissivity section prevents the heat loss from the shielded portion of the hot workpiece due to less thermal energy being transmitted through the shielding portion of the shield, thus maintaining a more uniform temperature at the shielded portion of the workpiece;

c) a high thermal transmissivity section in the rest of shield, the portion of the shield that does not engage the workpiece has high thermal transmissivity to allow more thermal energy from the heater means and from the hot workpiece to transmit through the shield without heating the shield, thus maintaining a cooler temperature at the portion of the shield that is not engaged with the workpiece.

The replaceable shield has been disclosed in a co-application titled "Replaceable shielding apparatus" U.S. application Ser. No. 09/589,635 filed Jun. 7, 2000, now U.S. Pat. No. 6,440,219 to Tue Nguyen. The apparatus includes a replaceable shield of comparable weight to that of the wafer, thus allowing the replacement of the shield in the same way as the replacement of the wafer. With this replaceable shielding apparatus, the system no longer needs to be shut down for shield replacement. The shield replacement can be performed after every wafer, after every 25 wafers, once a day, or once a week, depending on the degradation of the shield ring due to material deposited at the shield ring edge. The present invention further comprises multi-thermal zone sections to maintain a better temperature profile in the shield, thus offering better process performance.

DETAIL DESCRIPTION OF THE PREFERRED EMBODIMENT

Figure 1:
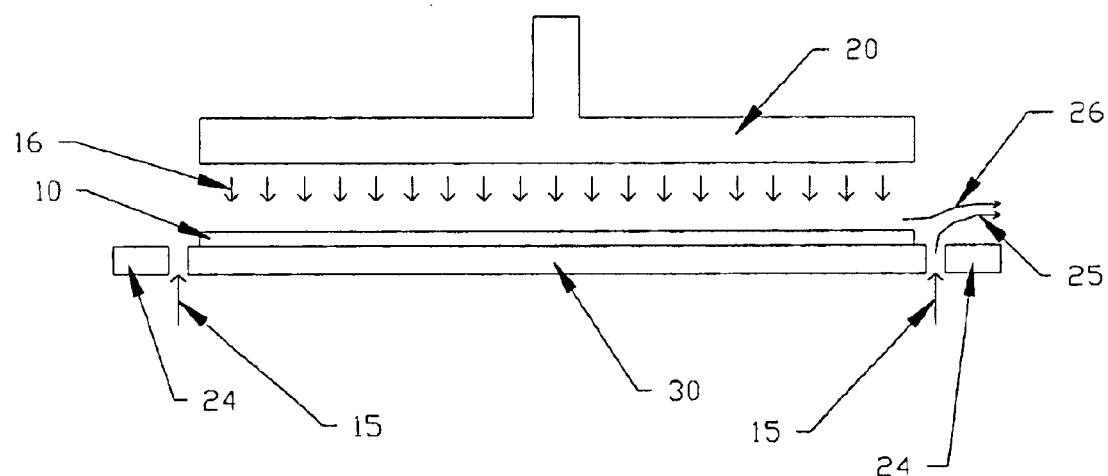
FIG. 1 shows a prior art edge exclusion apparatus.
Figure 2:
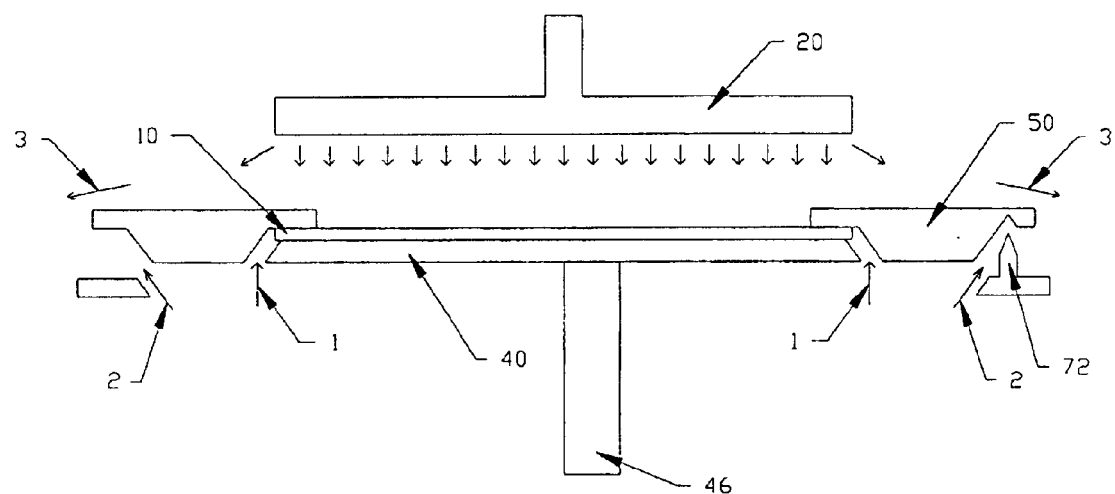
FIG. 2 shows another prior art edge exclusion apparatus.
Figure 3:
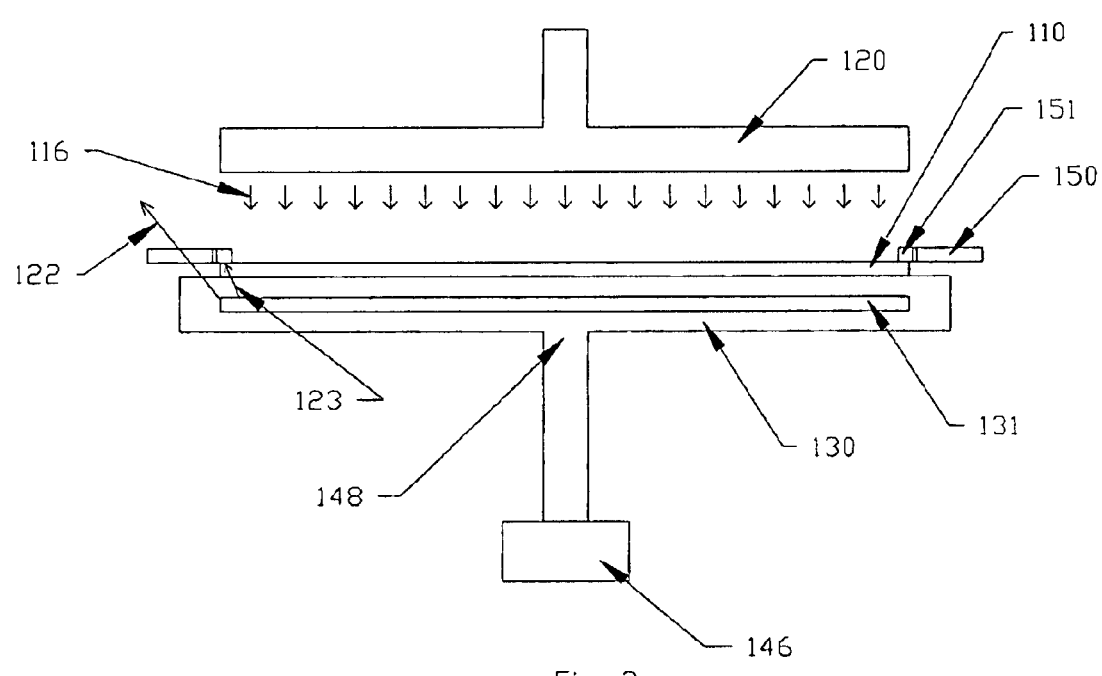
FIG. 3 shows the present invention of the multi-thermal zone shielding apparatus in the engaged position.

FIG. 3 shows the present invention of the multi-thermal zone shielding apparatus in the engaged position. The workpiece 110 is heated by the heater 131. In some aspects of the invention, the heater 131 is embedded in the workpiece support 130. The workpiece support 130 is connected to a moving means 148. In some aspects of the invention, the moving means 148 is a shaft connected to a susceptor lift 146. The susceptor lift 146 moves the shaft 148, and thus moves the workpiece support 130 between the disengaged and engaged positions. The multi-thermal zone shield 150 and 151 comprises two sections, a low transmissivity section 151 and a high transmissivity section 150. The shield 150/151 in the engaged position shields a portion of the workpiece 110 to prevent deposition at the workpiece edge and backside from the showerhead 120 that has having precursor flow 116. The high transmissivity section 150 allows the thermal energy 122 from the heater 131 to pass through the shield section 150, thus the shield section 150 does not absorb much heat from the heater 131 to raise its temperature appreciably. The low transmissivity section 151 allows little heat loss through the shield 151. Much heat 123 will be absorbed by the shield section 151, thus raising the temperature of the shield section 151 and this, in turn, keeps the edge of the wafer 110 at the same temperature as before. The heat supplied to the shield section will come from the heater 131. Using low thermal conductivity materials will further accomplish a temperature gradient in the two sections, a high temperature section 151 and a low temperature section 150.

Figure 4:
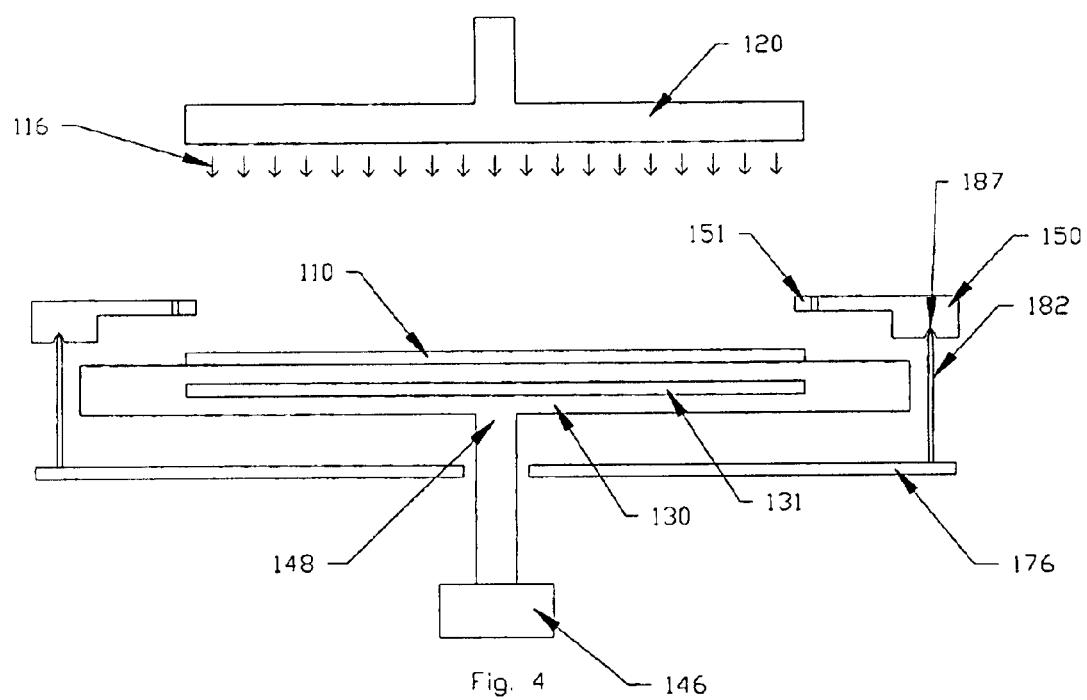
FIG. 4 shows the present invention of the multi-thermal zone shielding apparatus in the disengaged position.

FIG. 4 shows the present invention of the multi-thermal zone shielding apparatus in the disengaged position. The susceptor lift 146 moves the shaft 148 and the workpiece support 130, leaving the multi-thermal zone shield 150/151 in the disengaged position. The shield support 182 separates the shield 150/151 from the workpiece 110 to allow the removal of the workpiece 110. The shield support 182 is connected to a stationary wall 176 such as the chamber wall. Pin 187 allows the alignment of the shield 150/151 between the engaged and disengaged positions.

Figure 5:
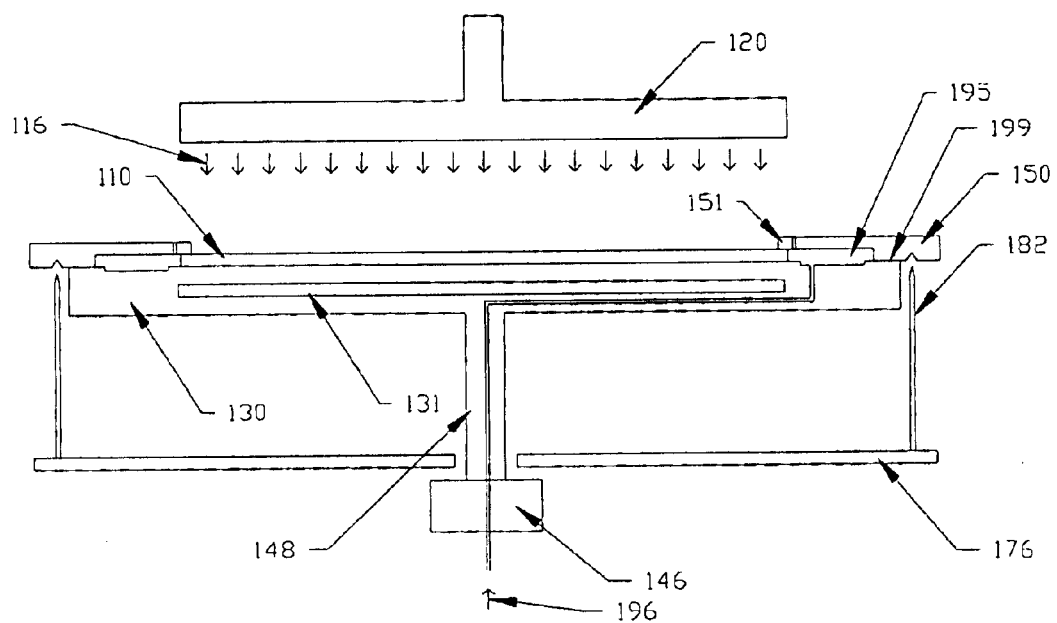
FIGS. 5 and 6 show the present invention of the multi-thermal zone shielding apparatuses in the engaged position with the purging gas.

FIG. 5 shows the present invention of the multi-thermal zone shielding apparatus in the engaged position with the purging gas. The purging gas 196 enters from outside the system to the cavity 195 defined by the workpiece support 130, the workpiece 110, and the shield 150/151. The shield 150/151 is resting on the workpiece support 130 at location 199, therefore the purging gas leakage should be minimum. The cavity 195 retains the purging gas, thereby creating a higher pressure in the cavity 195 than in the chamber, which further prevents the deposition at the shielding portion of the workpiece.

Figure 6:
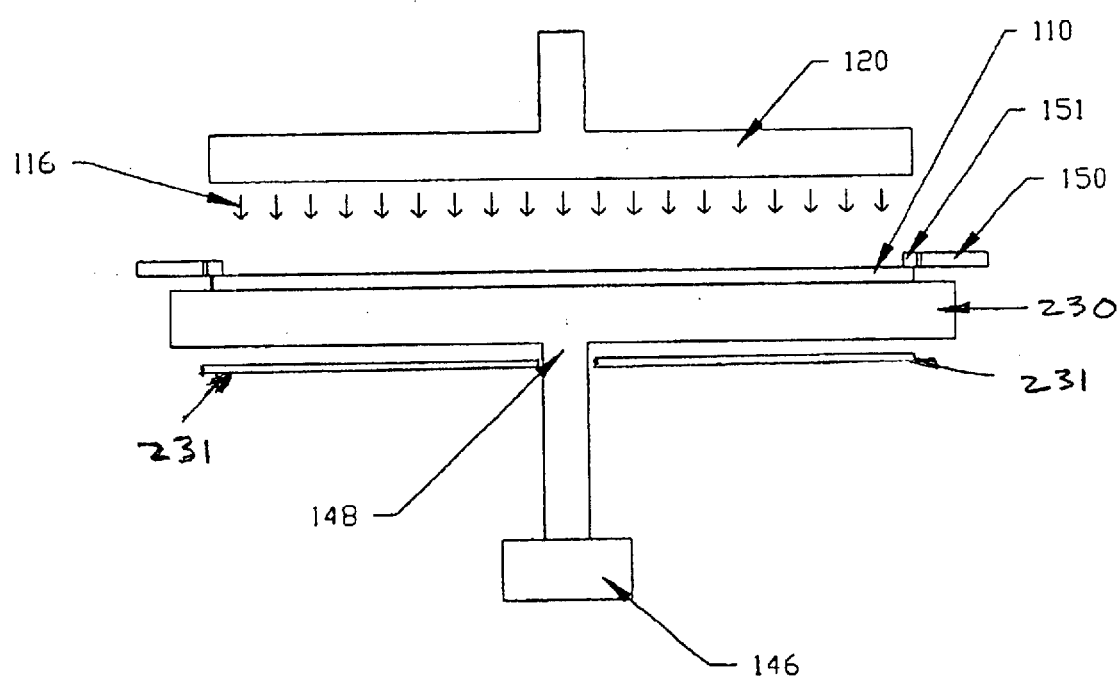

FIG. 6 shows another embodiment of the multi-thermal zone shielding apparatus in the engaged position. The workpiece 110 is heated by the lamp heater 231. The non-heated workpiece support 230 is connected to a moving means 148 which can be a shaft that is connected to a susceptor lift 146. The susceptor lift 146 moves the shaft 148, and thus moves the workpiece support 230 between the disengaged and engaged positions. The multi-thermal zone shield 150 and 151 comprises two sections, a low transmissivity section 151 and a high transmissivity section 150. The shield 150/151 in the engaged position shields a portion of the workpiece 110 to prevent deposition at the workpiece edge and backside from the showerhead 120 that has precursor flow 116.

What is claimed is:

1. A replaceable multi-thermal zone workpiece shielding plate apparatus for engaging a portion of the workplace and shielding the engaged portion of the workpiece during processing to prevent processing on the engaged portion of the workpiece in a high temperature processing system, the apparatus comprising:
  a) a replaceable shield of comparable weight to that of the workpiece for allowing replacement of the shield in the same way as the replacement of the workpiece;
  b) a low thermal transmissivity section in the portion of the shield that engages and shields the workpiece; and
  c) a high thermal transmissivity section in the rest of shield.

2. The apparatus of claim 1, further comprising an actuator for engaging the shield with the portion of the workpiece.

3. The apparatus of claim 1, further comprising a susceptor lift that is coupled to the workpiece.

4. The apparatus of claim 1, further comprising:
  a susceptor adapted to receive the workpiece; and
  a shaft that is coupled to the susceptor to engage the shield with the portion of the workpiece.

5. The apparatus of claim 1, further comprising a heater that is positioned underneath the workpiece to heat the workpiece within the system.

6. An apparatus as in claim 5 in which the heater further comprises a heated workpiece support having a heated top surface for supporting and heating the workpiece.

7. An apparatus as in claim 5 in which the heater comprises a lamp heater for heating the workpiece and the apparatus further comprises a non-heated workpiece support for supporting the workpiece.

* * * * *